(12) United States Patent
Chou et al.

(10) Patent No.: US 7,855,146 B1
(45) Date of Patent: Dec. 21, 2010

(54) PHOTO-FOCUS MODULATION METHOD FOR FORMING TRANSISTOR GATES AND RELATED TRANSISTOR DEVICES

(75) Inventors: Li-Heng Chou, Portland, ME (US); Jiankang Bu, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 255 days.

(21) Appl. No.: 11/901,654

(22) Filed: Sep. 18, 2007

(51) Int. Cl.
*H01L 21/47* (2006.01)

(52) U.S. Cl. .................. 438/673; 438/197; 438/669; 438/670; 257/E21.023; 257/E21.026; 257/E21.027

(58) Field of Classification Search ................ 257/315, 257/E21.023, 26, 27; 438/197, 669, 670, 438/673
See application file for complete search history.

(56) References Cited

U.S. PATENT DOCUMENTS

| | | | |
|---|---|---|---|
| 5,881,125 A | 3/1999 | Dao | |
| 5,989,756 A | 11/1999 | Nakae | |
| 6,015,736 A | 1/2000 | Luning et al. | |
| 6,057,081 A * | 5/2000 | Yunogami et al. | 430/313 |
| 6,153,478 A | 11/2000 | Lin et al. | |
| 6,229,683 B1 | 5/2001 | Goodwin-Johansson | |
| 6,238,850 B1 | 5/2001 | Bula et al. | |
| 6,296,991 B1 | 10/2001 | Lin | |
| 6,387,755 B1 | 5/2002 | Thurgate et al. | |
| 6,482,728 B2 | 11/2002 | Shin et al. | |
| 6,632,321 B2 | 10/2003 | Lill et al. | |
| 6,670,081 B2 | 12/2003 | Laidig et al. | |
| 6,716,570 B2 | 4/2004 | Nagarajan et al. | |
| 6,794,279 B1 * | 9/2004 | Stephen et al. | 438/585 |
| 6,846,618 B2 | 1/2005 | Hsu et al. | |
| 7,041,434 B2 * | 5/2006 | Raebiger et al. | 430/316 |
| 7,488,672 B2 * | 2/2009 | Kim | 438/514 |
| 7,537,979 B2 * | 5/2009 | Isobe et al. | 438/151 |
| 2002/0145915 A1 * | 10/2002 | Ogura et al. | 365/185.28 |
| 2004/0023499 A1 | 2/2004 | Hellig et al. | |
| 2006/0273166 A1 * | 12/2006 | Ohshima | 235/385 |
| 2007/0037098 A1 * | 2/2007 | Anderson et al. | 430/311 |

(Continued)

OTHER PUBLICATIONS

Li-Heng Chou, et al., "Method for Forming Non-Volatile Memory Cells and Related Apparatus and System", U.S. Appl. No. 12/151,437, filed May 7, 2008.

(Continued)

*Primary Examiner*—Wael M Fahmy
*Assistant Examiner*—Minchul Yang

(57) ABSTRACT

A method for forming a transistor gate includes performing a first exposure of a photo-resist material on a semiconductor device. The first exposure defines a line pattern in the photo-resist material. The method also includes performing a second exposure of the photo-resist material, where the second exposure trims a resist profile of the line pattern. The method further includes etching a conductive material on the semiconductor device to form a transistor gate based on the line pattern. The first exposure could represent a best focus exposure of the photo-resist material, and the second exposure could represent a positive focus exposure of the photo-resist material. The trimming of the line pattern's resist profile may cause the transistor gate to have at least one of a rounded edge and a rounded corner. This may allow a thicker insulating material, such as tetraethylorthosilicate, to be deposited around portions of the transistor gate.

20 Claims, 4 Drawing Sheets

U.S. PATENT DOCUMENTS

2007/0148973 A1    6/2007    Higashitani et al.
2008/0048164 A1*   2/2008    Odagawa .................... 257/2

OTHER PUBLICATIONS

Alfred K. Wong, "Microlithography: Trends, Challenges, Solutions, and Their Impact on Design", 2003 IEEE, pg. 12-21.

Jiankang Bu, et al., "System and Method for Providing Process Compliant Layout Optimization Using Optical Proximity Correction to Improve CMOS Compatible Non Volatile Memory Retention Reliability", U.S. Appl. No. 11/598,560, filed Nov. 13, 2006.

S. Manakli, et al., "Combination multiple focal planes and PSM for sub 120 nm node with KrF lithography: study of the proximity effects," Elsevier Microelectronic Engineering 61-62 (2002) pp. 123-132.

Benedetto Vigna, "More than Moore: micro-machined products enable new applications and open new markets", 2005 IEEE, 8 pages.

Office Action dated Mar. 3, 2010 in connection with U.S. Appl. No. 11/598,560.

* cited by examiner

PHOTO-FOCUS MODULATION METHOD FOR FORMING TRANSISTOR GATES AND RELATED TRANSISTOR DEVICES

TECHNICAL FIELD

This disclosure is generally directed to semiconductor devices and more specifically to a photo-focus modulation method for forming transistor gates and related transistor devices.

BACKGROUND

Transistors are used in numerous electronic devices in the world today. For example, transistors are often used in non-volatile memory (NVM) cells, which store data in a more permanent manner compared to volatile memory cells (such as random access memory). A conventional non-volatile memory cell often includes multiple transistors with a floating gate. A charge stored on the floating gate typically represents the logical value (a "1" or a "0") stored in the non-volatile memory cell.

In a conventional non-volatile memory cell, the floating gate is often covered with an oxide film (such as tetraethylorthosilicate or "TEOS") and a nitrided silicon oxide film (such as silicon oxynitride or "SiON"). An oxide (such as silicon dioxide) also often separates the floating gate from an underlying semiconductor substrate. In this type of non-volatile memory cell, the oxides ideally prevent electrons stored on the floating gate from being discharged unintentionally, which leads to failure of the non-volatile memory cell. However, it often remains possible for electrons stored on the floating gate to discharge to the semiconductor substrate through the oxide film and the nitrided silicon oxide film.

One approach to solving this problem involves selectively etching the nitrided silicon oxide film over the floating gate in a non-volatile memory cell, which makes the nitrided silicon oxide film thinner. This can reduce the discharge of electrons from the floating gate through the nitrided silicon oxide film, which may reduce the likelihood of failure of the non-volatile memory cell.

This approach, however, has various disadvantages. For example, etching silicon oxynitride films often requires the use of special tools, such as a poly etcher. Standard complimentary metal oxide semiconductor (CMOS) fabrication processes do not allow semiconductor wafers to be sent to a poly etcher after a silicon oxynitride film has been deposited (due to cobalt contamination or other issues). As a result, this approach may require a dedicated poly etcher that is used only to etch silicon oxynitride films in non-volatile memory cells. This would limit the use of the poly etcher, which is often an extremely expensive piece of equipment. While it is possible to use the same poly etcher to etch silicon oxynitride films in non-volatile memory cells and to process other CMOS devices, the poly etcher would need to be cleaned more frequently. For these reasons, this approach often increases the cost and time required to manufacture the non-volatile memory cells and other CMOS devices, decreases manufacturing efficiency, and increases material and labor costs.

BRIEF DESCRIPTION OF THE DRAWINGS

For a more complete understanding of this disclosure and its features, reference is now made to the following description, taken in conjunction with the accompanying drawings, in which:

FIGS. 3A through 3D illustrate an example technique for forming a transistor gate in a non-volatile memory cell or other device according to this disclosure;

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
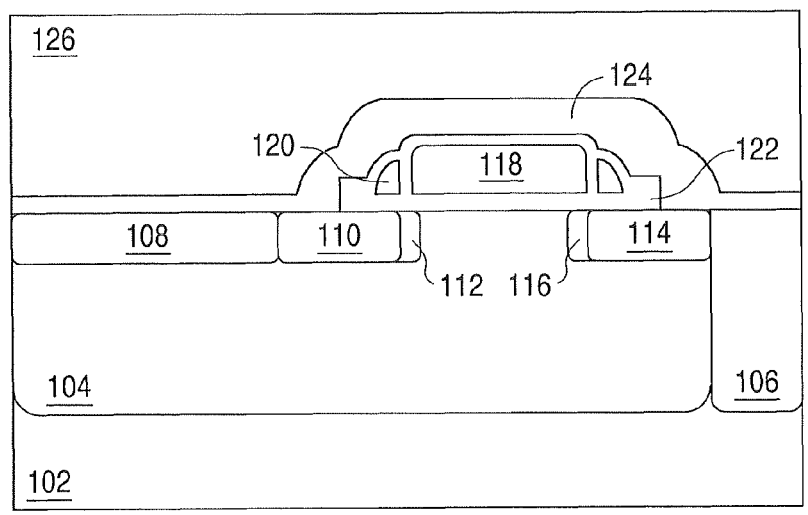
FIG. 1 illustrates an example transistor in a non-volatile memory cell or other device according to this disclosure.

FIG. 1 illustrates an example transistor 100 in a non-volatile memory cell or other device according to this disclosure. The embodiment of the transistor 100 shown in FIG. 1 is for illustration only. Other embodiments of the transistor 100 could be used without departing from the scope of this disclosure.

In this example, the transistor 100 is formed using a semiconductor substrate 102. The semiconductor substrate 102 could represent any suitable type of substrate, such as a p-type silicon substrate or other substrate.

Two wells 104-106 are formed in the semiconductor substrate 102. The wells 104-106 represent doped portions of the substrate 102. One or more of the wells can be used to form of the transistor 100, such as when the source, body, and drain of the transistor 100 are formed in one of the wells. The dopant(s) used to form the wells 104-106 could vary depending on the type of transistor 100 being formed. For example, the well 104 could represent an n-well that is used to form a p-channel metal oxide semiconductor (PMOS) transistor or a p-well that is used to form an n-channel metal oxide semiconductor (NMOS) transistor. Similarly, the well 106 could be used to separate the well 104 from other areas of the substrate 102. For instance, the well 106 could represent a p-well when the well 104 represents an n-well, or the well 106 could represent an n-well when the well 104 represents a p-well. The well 106 could also be omitted, such as when an undoped portion of the substrate 102 may suitably separate the well 104 from other areas of the substrate 102. Each of the wells 104-106 represents any suitable portion of the substrate 102 that has been doped with one or more suitable dopants.

In this example, doped regions 108-116 reside within the well 104. The doped regions represent portions of the substrate 102 that have been doped with one or more suitable dopants to form the transistor 100. For example, the doped region 108 could represent the body of the transistor 100, the doped regions 110-112 could represent the source of the transistor 100, and the doped regions 114-116 could represent the drain of the transistor 100. As a particular example, when the transistor 100 represents a PMOS transistor, the doped region 108 could represent an N+ or an n-type lightly doped drain (NLDD) region, the doped regions 110 and 114 could represent P+ doped regions, and the doped regions 112 and 116 could represent p-type lightly doped drain (PLDD) regions. Different dopings could also be used, such as when the transistor 100 represents an NMOS transistor. Each of the doped regions 108-116 represents any suitable portion of the substrate 102 that has been doped with one or more suitable dopants. Also, the positioning, arrangement, number, and type of doped regions could vary, such as based on the particular type of transistor 100 being used.

A conductive gate 118 is formed over the substrate 102 to form the gate of the transistor 100. In some embodiments, when the transistor 100 is used in a non-volatile memory cell, the gate 118 could represent a floating gate in the memory cell. In these embodiments, the gate 118 can be formed over two or more transistors and is used to store electrons in the memory cell. The amount of electrons stored on the gate 118 may identify whether the non-volatile memory cell has been programmed to a first logical state (such as a "1" state) or initialized or erased to a second logical state (such as a "0" state). The gate 118 could be formed from any suitable conductive material(s), such as polysilicon.

Two spacers 120 are located along the sides of the gate 118 in FIG. 1. The spacers 120 are used to help ensure proper alignment of the gate 118 with the doped regions of the substrate 102. The spacers 120 could be formed from any suitable material(s), such as an oxide.

One or more insulating materials 122 are located around the gate 118. The insulating materials 122 are used to separate the gate 118 from the substrate 102 and from overlying layers of material in the transistor 100. The insulating materials 122 could include any suitable material(s). As a particular example, the material located between the gate 118 and the spacers 120, between the gate 118 and the substrate 102, and between the spacers 120 and the substrate 102 could represent silicon dioxide. Also, the material located above the gate 118, above the spacers 120, and outside of the spacers 120 could represent tetraethylorthosilicate.

A nitrided silicon oxide layer 124 is formed over the insulating materials 122. The nitrided silicon oxide layer 124 represents any suitable nitrogen-silicon-oxide compound, such as silicon oxynitride. An encapsulation material 126 is formed over the nitrided silicon oxide layer 124. The encapsulation material 126 could be formed from any suitable material(s), such as plasma-enhanced chemical vapor deposition (PECVD) oxide.

Figure 2:
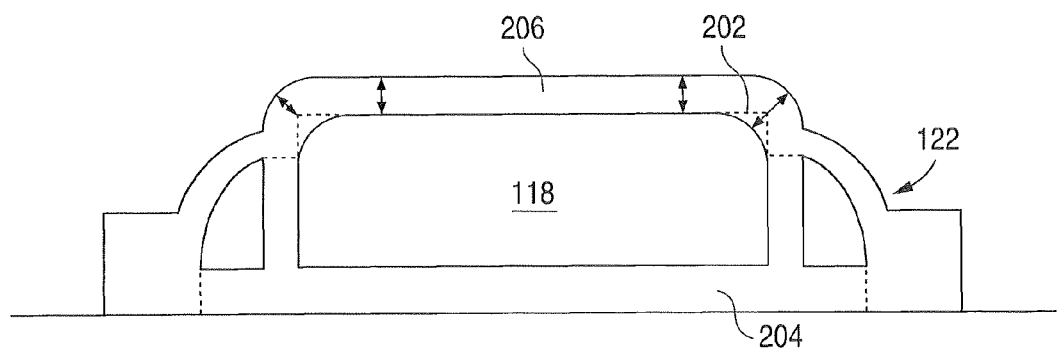
FIG. 2 illustrates additional details of a transistor gate in a non-volatile memory cell or other device according to this disclosure.

As shown in FIG. 1, the gate 118 has rounded upper edges and corners. This can be seen more clearly in FIG. 2, which illustrates additional details of the transistor gate 118 in a non-volatile memory cell or other device. In FIG. 2, the gate 118 has more rounded edges and corners compared to transistor gates in conventional memory cells or other devices. A conventional gate 202 in a conventional device is illustrated by the dashed line in FIG. 2.

As noted above, the oxide around the conventional gate 202 in a conventional device may still allow discharge of electrons to the semiconductor substrate. One approach to solving this problem is to thin the nitrided silicon oxide film over the conventional gate 202, which presents various problems as described above.

As can be seen in FIG. 2, one reason that conventional gates 202 may still allow the discharge of electrons to the semiconductor substrate is the "thinning" of the insulating material around the edges and corners of the conventional gate 202. As shown in FIG. 2, the insulating material 122 around the upper edges and corners of the conventional gate 202 is much thinner compared to, for example, the thickness of the insulating material 122 above the conventional gate 202. This could be due, for example, to oxide deposition process limitations associated with the deposition of tetraethylorthosilicate. In some conventional non-volatile memory cells and other devices, the insulating material 122 can be at least three times as thin at the upper edges and corners of the conventional gate 202 compared to over the conventional gate 202. The thinner insulating material at these points permits higher backend leakage current from the conventional gate 202, which degrades the ability of the conventional gate 202 to retain electrons (and can lead to retention issues in conventional non-volatile memory cells).

In accordance with this disclosure, the gate 118 of the transistor 100 is fabricated so that it has more rounded edges and corners. The rounded edges and corners allow more insulating material 122 to be deposited around the edges and corners of the gate 118, which can be seen in FIG. 2. This thicker insulating material 122 helps to decrease backend leakage current from the gate 118 of the transistor 100, which enhances the ability of the gate 118 to retain electrons (and can lead to better retention in non-volatile memory cells). One technique for forming the gate 118 with rounded edges and corners is shown in FIGS. 3A through 3D, which are described below.

In the example shown in FIG. 2, the insulating material 122 is divided into two portions by the dotted lines. One portion 204 could represent silicon dioxide or other material(s) deposited prior to formation of the gate 118. Another portion 206 could represent tetraethylorthosilicate or other material(s) deposited after formation of the gate 118. This division of the insulating material 122 is for illustration only. Any suitable number of oxide or other material(s) in any suitable arrangement could be used in the transistor 100.

The various structures shown in FIGS. 1 and 2 could be formed in any suitable manner using any suitable technique. For example, the various wells 104-106 and doped regions 108-116 could be formed by masking the appropriate regions of the substrate 102 and performing the appropriate implantations. Also, the insulating material(s) 122 could be formed by masking the appropriate regions of the substrate 102 and oxidizing the exposed portions of the substrate 102 and/or by depositing an oxide or other material(s) on the substrate 102. Further, the gate 118 could be formed by depositing a layer of conductive material(s) and etching the layer, and additional conductive layers that couple the transistor 100 to external lines or components could be formed in a similar manner. In addition, conductive interconnects that couple the transistor 100 to the conductive layers (for coupling to the external lines or components) could be formed by etching trenches or vias in the encapsulation material 126 and depositing polysilicon or other conductive material(s) in the etched trenches or vias. However, the structures shown in FIGS. 1 and 2 could be formed in any other suitable manner.

Although FIG. 1 illustrates one example of a transistor 100 in a non-volatile memory cell or other device and FIG. 2 illustrates additional details of a transistor gate 118 in the non-volatile memory cell or other device, various changes may be made to FIGS. 1 and 2. For example, the transistor 100 could have any other suitable cross-section or arrangement. As particular examples, the doped regions in the substrate 102 and the position of the gate 118 could vary depending on the type of transistor 100 being formed. Also, any other or additional structures could be formed above the substrate 102. In addition, FIGS. 1 and 2 illustrate one example structure in which a transistor gate having rounded edges and corners can be used. This type of transistor gate structure could be used in any other suitable transistor device and is not limited to use in non-volatile memory cells or to the specific transistor shown in FIGS. 1 and 2.

FIGS. 3A through 3D illustrate an example technique for forming a transistor gate in a non-volatile memory cell or other device according to this disclosure. For ease of explanation, FIGS. 3A through 3D are described as being used to form the transistor gate 118 in the transistor 100 of FIGS. 1 and 2. The technique shown in FIGS. 3A through 3D could be used to form a gate in any suitable transistor in any suitable non-volatile memory cell or other device. Also, various elements from FIGS. 1 and 2 (such as various insulating layers or other elements) have been omitted from FIGS. 3A through 3D for ease of illustration.

Figure 3A:
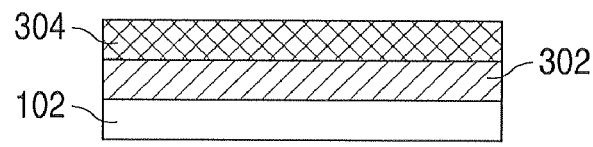

As shown in FIG. 3A, a conductive layer 302 can be deposited over the substrate 102 (such as on an oxide layer on the substrate). The conductive layer 302 includes any suitable conductive material or materials (such as polysilicon) and can be deposited in any suitable manner. A photo-resist layer 304 is formed over the conductive layer 302. The photo-resist layer 304 includes any suitable photo-resist material or materials and can be deposited on the conductive layer 302 in any suitable manner, such as by spin-coating. The photo-resist layer 304 may require further processing, such as pre-baking, to prepare the photo-resist layer 304 for use.

After the photo-resist layer 304 is ready for further processing, the structure undergoes photolithography to pattern the photo-resist layer 304 and etch the conductive layer 302. In some embodiments, to form the gate 118 of the transistor 100, the photo-resist layer 304 undergoes two exposures. The first exposure patterns the photo-resist layer 304 in a way that is generally suitable for forming the gate 118 of the transistor 100 and for forming gates or other structures in other CMOS devices (such as a gate in a conventional CMOS transistor). The second exposure modifies the photo-resist layer 304 so that the gate 118 of the transistor 100 has rounded edges and corners as shown in FIGS. 1 and 2.

As shown in FIG. 3B, a light source 306 generates light used to pattern the photo-resist layer 304. The light source 306 includes any suitable source of light or other radiation that can be used to pattern photo-resist material. The light source 306 could, for example, represent an ultraviolet light source.

The light from the light source 306 passes through a first reticle 308a. The reticle 308a creates a pattern of light on the photo-resist layer 304, which allows the photo-resist layer 304 to be patterned in a specific way. In particular, the reticle 308a allows the light from the light source 306 to reach certain portions of the photo-resist material and prevents the light from reaching other portions of the photo-resist material. In this example, the reticle 308a allows the light from the light source 306 to reach the majority of the photo-resist layer 304, and the reticle 308a blocks the light from reaching two strips of photo-resist material on the substrate 102. The reticle 308a includes any suitable structure for creating patterns of light on photo-resist material.

The light from the light source 306 that passes through the reticle 308a also passes through a projection lens 310. The projection lens 310 can be used to focus the light from the light source 306 onto the photo-resist layer 304. The projection lens 310 includes any suitable optics for focusing light.

In FIG. 3B, the projection lens 310 and/or the substrate 102 is positioned so that the pattern from the reticle 308a is clearly imaged on the photo-resist layer 304. In some embodiments, this position can represent the "best focus" position and can be represented by a "best focus" plane 312a. In this position, the pattern from the reticle 308a is sharply focused on the photo-resist layer 304, possibly to the best extent achievable. At this first focus, the photo-resist layer 304 is patterned by the light from the light source 306. This represents the first exposure of the photo-resist layer 304 and removes all of the photo-resist layer 304 except for two portions 314 and 316.

As shown in FIG. 3C, the light source 306 is again used to pattern the photo-resist layer 304 on the substrate 102 during a second exposure. In this second exposure, the light passes through a second reticle 308b. In this example, the reticle 308b prevents the light from the light source 306 from reaching the majority of the photo-resist layer 304, and the reticle 308b allows the light to reach only the portion 314 of the photo-resist layer 304. This protects the portion 316 of the photo-resist layer 304 from the second exposure. In FIG. 3C, the projection lens 310 and/or the substrate 102 is positioned so that the pattern from the reticle 308b is "positively focused" on the photo-resist layer 304. This refers to the fact that the focal plane used during positive focus (second exposure) is closer to the reticle 308b compared to the focal plane used during best focus (first exposure).

Figure 3D:
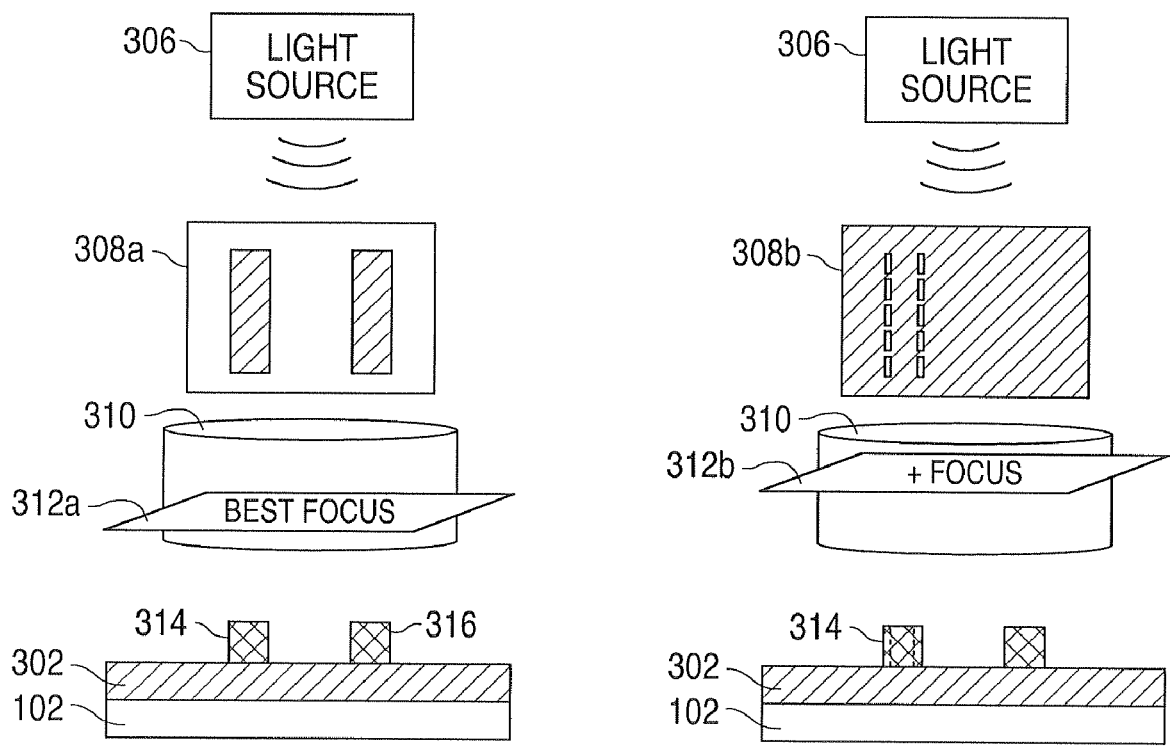
Figure 3D:
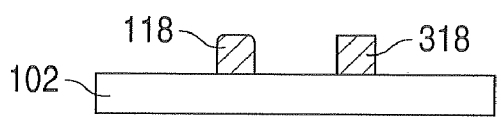

As shown in FIG. 3D, once the photo-resist layer 304 is patterned using two exposures, the conductive layer 302 is etched, and the remaining portions of the photo-resist layer 304 are removed (such as by stripping). Any suitable etch could be performed to etch the conductive layer 302, such as plasma, wet, or dry etching. The double-exposed portion 314 of the photo-resist layer 304 allows the gate 118 to be formed in the conductive layer 302 with rounded edges and corners. The single-exposed portion 316 of the photo-resist layer 304 allows a gate 318 to be formed in the conductive layer 302 with more standard (square) edges and corners.

Using the technique shown in FIGS. 3B and 3C, the first exposure performed using the reticle 308a can be done using a sharp focus to pattern the photo-resist layer 304. This can define the area where the gate 118 of the transistor 100 is being formed and the area where a gate of a conventional CMOS device is being formed. The second exposure performed using the reticle 308b exposes the photo-resist layer 304 to the pattern of the reticle 308b at a shifted focus. This trims the edges and corners of the area where the gate 118 of the transistor 100 is being formed, without affecting the area where the conventional CMOS device's gate is being formed. In general, the first exposure defines the line patterns, and the second exposure trims the lines' resist profiles without changing the lines' dimensions (such as their length and width). Two exposures are used since using a positive focus during the first exposure could alter the edge/corner geometry as well as the overall dimensions of the lines being formed. Also, this technique complies with standard CMOS processes and may thus be used for mass production without requiring dedicated tools or more frequent tool cleanings. In addition, the same photo-resist layer 304 can be exposed twice, rather than requiring two separate photo-resist layers (and the added expense of an extra photo-resist coating step and an extra photo-resist stripping step).

Although FIGS. 3A through 3D illustrate one example of a technique for forming a transistor gate in a non-volatile memory cell or other device, various changes may be made to FIGS. 3A through 3D. For example, this technique could be used to round the edges and corners of a transistor gate in a non-volatile memory cell or other device. Also, the same or similar technique could be used to alter any suitable transistors (such as any CMOS transistors) to provide desired characteristics, such as decreased leakage current and/or increased breakdown voltage. In addition, while shown as being used to form a single rounded gate 118 and a single standard gate 318, this technique could be used to form any suitable number of transistors in any suitable arrangement.

Figure 4:
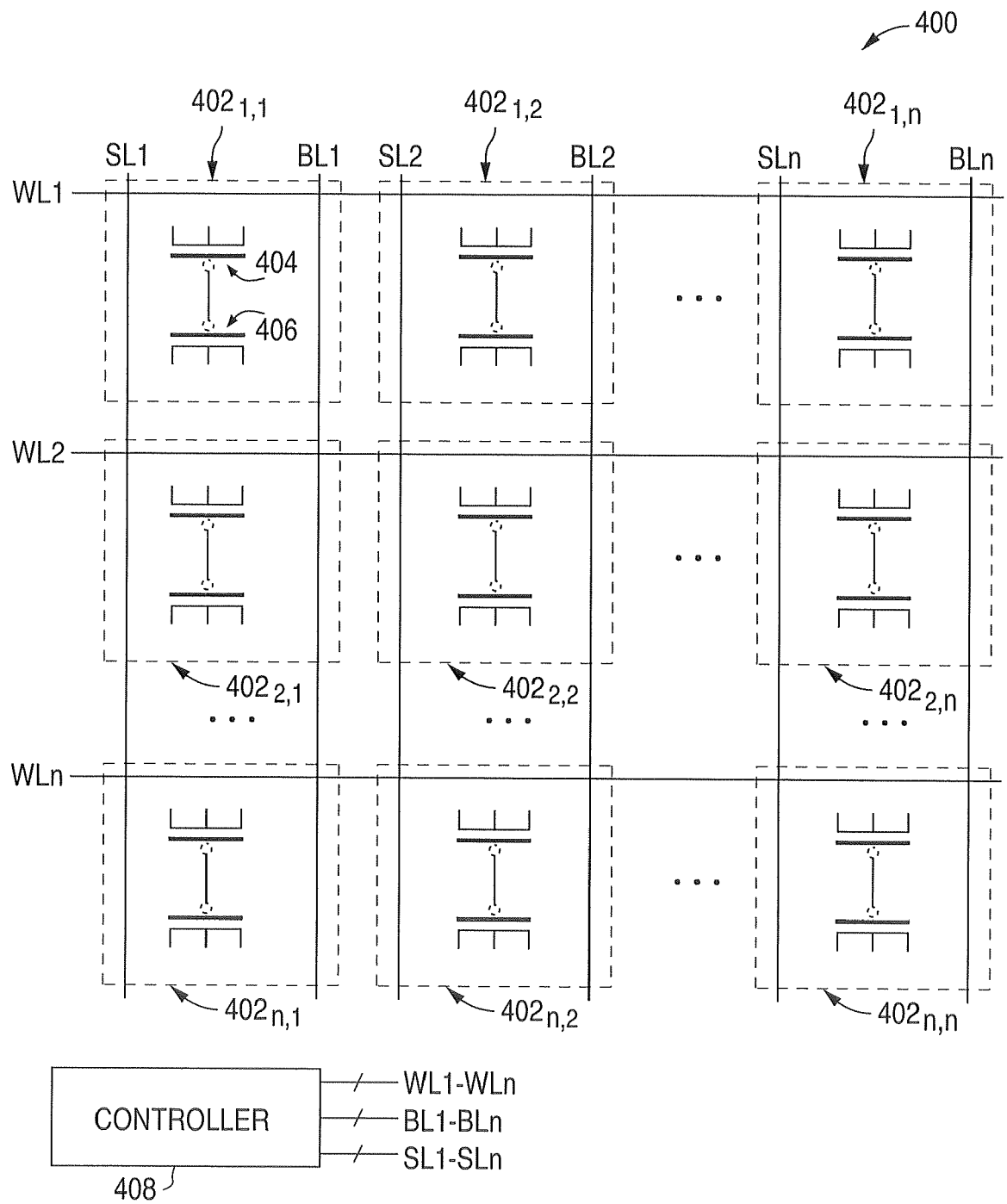
FIG. 4 illustrates an example non-volatile memory cell array according to this disclosure.

FIG. 4 illustrates an example non-volatile memory cell array 400 according to this disclosure. The embodiment of the memory cell array 400 shown in FIG. 4 is for illustration only.

Other embodiments of the memory cell array 400 could be used without departing from the scope of this disclosure.

In this example, the memory cell array 400 is formed from various memory cells $402_{1,1}$-$402_{1,n}$, $402_{2,1}$-$402_{2,n}$, . . . $402_{n,1}$-$402_{n,n}$. Each memory cell could include one or more transistors in any suitable configuration. In this example embodiment, each memory cell includes two transistors 404-406, where gates of the transistors 404-406 are coupled together to form a floating gate. While shown as PMOS transistors in this example, the transistors 404-406 could represent any other suitable type of transistor or combination of transistor types. At least some of the transistors in the memory cells have gates with rounded edges and corners as shown in FIGS. 1 and 2.

Each memory cell in this example can be coupled to one or more signal lines. For example, each memory cell could be coupled to one or more write lines (WL1-WLn), one or more bit lines (BL1-BLn), and/or one or more source lines (SL1-SLn). Each of the write, bit, and signal lines represents a wire, trace, or other electrically conductive line that is capable of conducting a voltage or current signal.

The transistors 404-406 could have their sources, bodies, and drains coupled to any of these signal lines, and appropriate voltages can be applied to the signal lines to program, read, and erase the memory cells. As a particular example, the transistor 404 could have its source, body, and drain coupled to one of the write lines, and each transistor 406 could have its source and body coupled to one of the bit lines and its drain grounded. In this arrangement, a memory cell in the array 400 can be erased, programmed, or read by applying a suitable voltage to its write line and/or a suitable voltage to its bit line. Examples of the various signals that can be applied to the various signal lines during operation of the memory cell array 400 are shown in Table 1. Table 1 assumes that the transistors 404-406 have a gate oxide thickness of 70 Å and that the memory cells are block-erased by row.

TABLE 1

|  | Selected WL | Selected BL | Unselected WL | Unselected BL |
|---|---|---|---|---|
| Program | $V_{Prog\_WL}$ | $V_{Prog\_BL}$ | 0 | 0 |
| Erase | $V_{Erase}$ | 0 | $V_{Erase}$ | 0 |
| Read | 0 | $V_{Read}$ | 0 | 0 |

Here, $V_{Prog\_WL}$ may equal or approximately equal 6V, $V_{Prog\_BL}$ may equal or approximately equal 5V, $V_{Erase}$ may equal or approximately equal 12V, and $V_{Read}$ may equal or approximately equal 3.3V. These values are for illustration only and may vary depending on the implementation of the memory cells in the array 400.

As shown in FIG. 4, the memory array 400 also includes or is coupled to a controller 408. The controller 408 represents any suitable structure for controlling the operation of the memory cells in the array 400. In this example, the controller 408 is coupled to the write, bit, and source lines of the array 400 and provides suitable control signals to the lines. This enables the controller 408 to control the erasure, programming, and reading of the memory cells in the array 400.

As noted above, one or more of the transistors 404-406 in at least one of the memory cells in the array 400 could include a gate 118 having rounded edges and corners. This allows an oxide or other material deposited over the gate 118 to be thicker near the edges and corners of the transistor (compared to an oxide or other material deposited over conventional transistor gates). This helps to reduce leakage current and increase the reliability of the memory array 400. This can also be done in a manner that uses standard CMOS practices, reduces manufacturing times, and lowers manufacturing costs.

Although FIG. 4 illustrates one example of a non-volatile memory cell array 400, various changes may be made to FIG. 4. For example, the memory cell array 400 could have any suitable number of memory cells in any suitable arrangement. As a particular example, while shown as an n×n array, the memory cell array 400 could have any other equal or non-equal dimensions. Also, the memory cells in the memory cell array 400 could be implemented in any other suitable manner using any number of transistors, at least one of which has rounded edges and corners.

Figure 5:
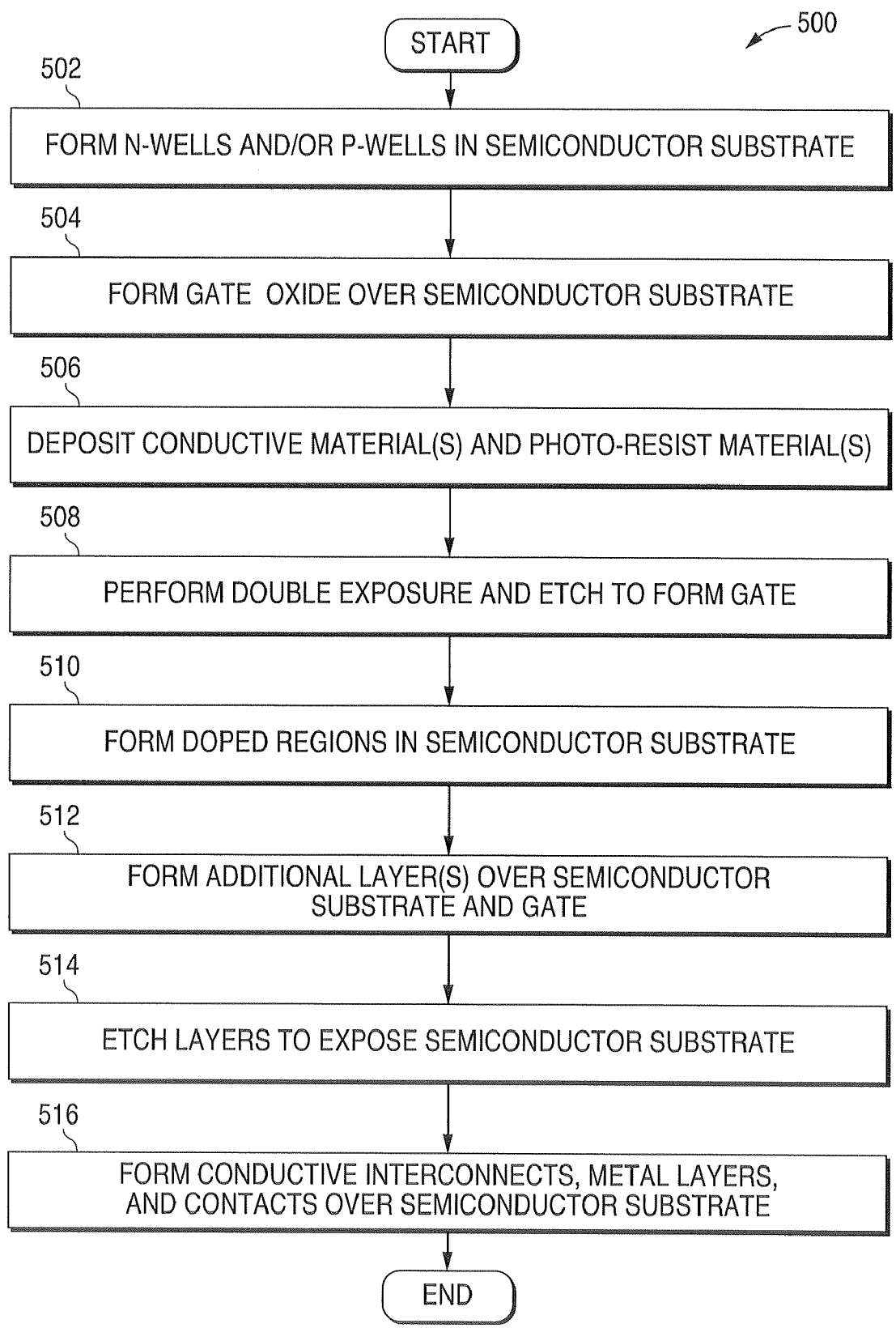
FIG. 5 illustrates an example method for forming a transistor in a non-volatile memory cell or other device according to this disclosure.

FIG. 5 illustrates an example method 500 for forming a transistor in a non-volatile memory cell or other device according to this disclosure. The embodiment of the method 500 shown in FIG. 5 is for illustration only. Other embodiments of the method 500 could be used without departing from the scope of this disclosure. Also, for ease if explanation, the method 500 is described with respect to the transistor 100 of FIGS. 1 and 2. The method 500 could be used with any suitable memory cell or other device using one or more transistors.

One or more n-wells and/or p-wells are formed in a semiconductor substrate at step 502. This could include, for example, forming one or more n-wells and/or p-wells in the substrate 102 by masking the appropriate area(s) of the substrate 102 and performing the appropriate implantation(s). The type of wells formed may vary depending on, for example, whether PMOS and/or NMOS transistors are used to form the memory cell or other device. As a particular example, an n-well could be formed in the substrate 102 for each PMOS transistor, and a p-well could be formed in the substrate 102 for each NMOS transistor. This could also include performing a composite step prior to the formation of the wells to prepare the substrate 102 for processing.

A gate oxide is formed over the semiconductor substrate at step 504. This could include, for example, oxidizing the surface of the substrate 102. This could also include depositing an oxide on the surface of the substrate 102. Any suitable oxide could be used in this step, such as silicon dioxide.

One or more conductive materials are deposited over the gate oxide and one or more photo-resist materials are deposited over the conductive materials at step 506. This could include, for example, depositing one or more layers 302 of conductive material(s), such as polysilicon, over the gate oxide. This could also include depositing a photo-resist layer 304 over the conductive layer 302.

A double exposure process and an etch are performed to form a transistor gate at step 508. This could include, for example, using the double exposure technique illustrated in FIGS. 3A through 3D to expose the photo-resist layer 304 into the proper pattern. In particular, this may include exposing a portion of the photo-resist layer 304 twice, once using best focus and once using positive focus. This may also include performing a suitable etch to etch the conductive layer 302 and form at least one transistor gate 118 having rounded edges and corners.

Doped regions are formed in the semiconductor substrate at step 510. This could include, for example, masking the appropriate areas of the substrate 102 and performing the appropriate implantations. The number and type of doped regions may vary depending on, for example, the type of transistors (PMOS and/or NMOS) used to form the memory cell or other device. As a particular example, this could include performing a PLDD implant and an NLDD implant, followed by $N_+$ and $P_+$ implants. It may be noted that various ones of these implants could be omitted, such as when an omitted implant is not needed to form the transistors in a memory cell or other device.

One or more additional layers may be formed over the semiconductor substrate and the gate at step 512. This may include, for example, depositing a layer of tetraethylorthosilicate, a layer of silicon oxynitride, and a layer of PECVD oxide over the gate 118 and the substrate 102. These particular materials are for illustration only. Any other or additional material(s) could be formed over the gate 118 and the substrate 102.

The appropriate layers of material are etched to expose portions of the semiconductor substrate at step 514. This could include, for example, etching through the layer of tetraethylorthosilicate, the layer of silicon oxynitride, and the layer of PECVD oxide over the substrate 102. This could also include etching through the gate oxide formed over the substrate 102. Any suitable etching can be performed in this step. As particular examples, vias or trenches can be etched through these layers to the various doped regions of the substrate 102 (representing the sources, drains, and bodies of the transistors in the device being formed). At this point, conductive interconnects, contacts, and metal layers can be formed over the semiconductor substrate at step 516. This could include, for example, depositing one or more conductive materials into the etched vias or trenches to form interconnects to the transistor(s) in the device being formed. This could also include depositing one or more conductive materials over the interconnects to form contact pads for the transistor(s) in the device being formed. This could further include forming additional metal layers containing appropriate traces and circuitry over the contact pads. Any other or additional processing steps could take place after formation of the transistors in the device being formed.

Although FIG. 5 illustrates one example of a method 500 for forming a transistor in a non-volatile memory cell or other device, various changes may be made to FIG. 5. For example, while shown as a series of steps, various steps in FIG. 5 could overlap, occur in parallel, occur multiple times, or occur in a different order.

It may be advantageous to set forth definitions of certain words and phrases that have been used within this patent document. The term "couple" and its derivatives refer to any direct or indirect communication between two or more components, whether or not those components are in physical contact with one another. The term "program" and its derivatives refer to any operation to store data, whether that operation is referred to as a write operation, a program operation, or other type of operation. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising:
    performing a first exposure of a photo-resist material on a semiconductor device, the first exposure defining a line pattern in the photo-resist material, the line pattern having dimensions;
    performing a second exposure of the photo-resist material, the second exposure trimming a resist profile of the line pattern without changing the dimensions of the line pattern; and
    etching a conductive material on the semiconductor device to form a transistor gate based on the line pattern.

2. The method of claim 1, wherein:
    performing the first exposure comprises performing a best focus exposure of the photo-resist material; and
    performing the second exposure comprises performing a positive focus exposure of the photo-resist material.

3. The method of claim 1, wherein the trimming of the resist profile of the line pattern forms at least one of a rounded edge and a rounded corner in the photo-resist material.

4. The method of claim 3, further comprising:
    depositing an insulating material over the transistor gate and on at least one of a rounded edge and a rounded corner of the transistor gate.

5. The method of claim 4, further comprising:
    depositing a nitrided silicon oxide over the insulating material.

6. The method of claim 5, wherein:
    the insulating material comprises tetraethylorthosilicate; and
    the nitrided silicon oxide comprises silicon oxynitride.

7. The method of claim 1, further comprising:
    forming one or more doped regions in a semiconductor substrate of the semiconductor device.

8. The method of claim 7, further comprising:
    forming a gate oxide over the semiconductor substrate;
    depositing the conductive material over the gate oxide; and
    depositing the photo-resist material over the conductive material.

9. The method of claim 1, wherein etching the conductive material to form the transistor gate comprises etching the conductive material to form a floating gate in a non-volatile memory cell.

10. The method of claim 1, wherein etching the conductive material comprises forming the transistor gate to have a lower surface with the same dimensions as the line pattern and an upper surface having at least one rounded edge.

11. The method of claim 1, wherein:
    performing the first exposure comprises exposing the photo-resist material to light passing through a first reticle having a first pattern; and
    performing the second exposure comprises exposing the photo-resist material to light passing through a second reticle having a second pattern different from the first pattern.

12. The method of claim 11, wherein:
    the first reticle has at least one light blocking portion; and
    the second reticle has at least one opening, the at least one opening at least partially overlapping with the at least one light blocking portion.

13. A method comprising:

forming a line pattern using photo-resist material over a semiconductor substrate, the line pattern having length and width dimensions;

trimming a resist profile of the line pattern without changing the length and width dimensions of the line pattern; and etching a conductive material to form a transistor gate using the line pattern.

14. The method of claim 13, wherein:

forming the line pattern comprises performing a first exposure of the photo-resist material; and trimming the resist profile of the line pattern comprises performing a second exposure of the photo-resist material.

15. The method of claim 14, wherein:

performing the first exposure comprises performing a best focus exposure of the photo-resist material; and performing the second exposure comprises performing a positive focus exposure of the photo-resist material.

16. The method of claim 13, wherein trimming the resist profile of the line pattern forms a rounded edge or corner of the line pattern.

17. The method of claim 16, wherein etching the conductive material comprises forming a rounded edge or corner of the transistor gate.

18. A method comprising:

depositing a conductive material over a semiconductor substrate;

depositing a photo-resist material over the conductive material;

patterning the photo-resist material to form a line pattern, the line pattern having length and width dimensions;

trimming a resist profile of the line pattern without changing the length and width dimensions of the line pattern; and etching the conductive material to form a transistor gate using the line pattern.

19. The method of claim 18, wherein:

patterning the photo-resist material comprises performing a first exposure of the photo-resist material, the first exposure comprising a best focus exposure of the photo-resist material; and trimming the resist profile of the line pattern comprises performing a second exposure of the photo-resist material, the second exposure comprising a positive focus exposure of the photo-resist material.

20. The method of claim 19, wherein:

performing the first exposure comprises using a first reticle that exposes portions of the photo-resist material not forming the line pattern to a light source, the first reticle having at least one light blocking portion; and performing the second exposure comprises using a second reticle that exposes corners or edges of the line pattern to the light source, the second reticle having at least one opening, the at least one opening at least partially overlapping with the at least one light blocking portion.

* * * * *